US011956907B2

(12) United States Patent
Jung et al.

(10) Patent No.: US 11,956,907 B2
(45) Date of Patent: Apr. 9, 2024

(54) DISPLAY DEVICE

(71) Applicant: Samsung Display Co., Ltd., Yongin-si (KR)

(72) Inventors: Sung-Ki Jung, Anyang-si (KR); Dong-Su Yee, Cheonan-si (KR)

(73) Assignee: Samsung Display Co., Ltd., Yongin-si (KR)

(*) Notice: Subject to any disclaimer, the term of this patent is extended or adjusted under 35 U.S.C. 154(b) by 560 days.

(21) Appl. No.: 17/062,638

(22) Filed: Oct. 5, 2020

(65) Prior Publication Data

US 2021/0227706 A1 Jul. 22, 2021

(30) Foreign Application Priority Data

Jan. 16, 2020 (KR) ........................ 10-2020-0006145

(51) Int. Cl.
*H05K 5/00* (2006.01)
*H05K 5/02* (2006.01)
*G02B 1/14* (2015.01)

(52) U.S. Cl.
CPC ......... *H05K 5/0017* (2013.01); *H05K 5/0217* (2013.01); *G02B 1/14* (2015.01)

(58) Field of Classification Search
None
See application file for complete search history.

(56) References Cited

U.S. PATENT DOCUMENTS

| | | | | |
|---|---|---|---|---|
| 10,466,822 B2 | 11/2019 | Kim et al. | | |
| 2017/0147117 A1* | 5/2017 | Song | ....................... | G06F 3/044 |
| 2017/0287992 A1 | 10/2017 | Kwak et al. | | |
| 2018/0157362 A1* | 6/2018 | Kim | ....................... | G06F 3/0412 |
| 2018/0223127 A1* | 8/2018 | Cho | ....................... | C08L 71/02 |
| 2019/0177215 A1 | 6/2019 | Jin et al. | | |
| 2019/0246018 A1* | 8/2019 | Rho | ....................... | G03B 9/02 |
| 2019/0252475 A1* | 8/2019 | Sung | ....................... | H01L 51/5203 |
| 2019/0259310 A1* | 8/2019 | Ha | ....................... | G09F 9/301 |
| 2019/0288047 A1* | 9/2019 | Jeong | ....................... | H01L 51/5253 |

FOREIGN PATENT DOCUMENTS

| | | |
|---|---|---|
| KR | 10-2017-0111827 | 10/2017 |
| KR | 10-2018-0026288 | 3/2018 |
| KR | 10-2018-0063633 | 6/2018 |
| KR | 10-2019-0049769 | 5/2019 |
| KR | 10-1986762 | 6/2019 |

* cited by examiner

*Primary Examiner* — Anthony J Frost
(74) *Attorney, Agent, or Firm* — H.C. Park & Associates, PLC

(57) ABSTRACT

A display device includes: a display panel having a first opening disposed in a display area; a window disposed on the display panel and including a second opening communicating with the first opening; and a light passing member at least partially within the first and second openings. Display devices constructed in this manner may resist loads and impacts.

17 Claims, 11 Drawing Sheets

DISPLAY DEVICE

CROSS-REFERENCE TO RELATED APPLICATION(S)

This application claims priority from and the benefit of Korean Patent Application No. 10-2020-0006145, filed on Jan. 16, 2020, which is hereby incorporated by reference for all purposes as if fully set forth herein.

BACKGROUND

Field

Exemplary implementations of the invention relate generally to a display device, more particularly, relate to the display device which resists a load and an impact.

Discussion of the Background

Recently, with a development of technologies related to display devices, flexible display devices have been developed. The flexible display devices include a curved display device, a bended display device, a foldable display device, a rollable display device, and so on. In addition, to reduce a non-display area of the display device, a structure in which a functional module (for example, a camera module, an illumination sensor, etc.) is disposed under an opening has been developed, after forming the opening in a portion of a display area.

A window of the flexible display device may be thinner than a window of a rigid display device. When the opening is formed in the flexible display device having a thin window, the window may be deformed by a load applied to the window which overlaps the opening. In addition, the window may be damaged by an impact applied to the window which overlaps the opening. When the window is deformed or damaged, foreign matter such as dust and moisture may penetrate into the display device, and an efficiency of the functional module disposed under the window may decrease.

The above information disclosed in this Background section is only for understanding of the background of the inventive concepts, and, therefore, it may contain information that does not constitute prior art.

SUMMARY

Display devices constructed according to the principles and exemplary implementations of the invention may provide a display device which resists a load and an impact.

Additional features of the inventive concepts will be set forth in the description which follows, and in part will be apparent from the description, or may be learned by practice of the inventive concepts.

A display device according to one or more exemplary embodiments may include a light passing member inserted into an opening in a display area. The light passing member may prevent foreign matters such as dust and moisture from penetrating inside of the display device and may protect the functional module from an impact. In addition, the light passing member may have a thickness larger than a thickness of a window. Accordingly, a deformation and/or a damage of the light passing member due to a load or the impact which are applied to the light passing member may be prevented. Furthermore, the light blocking member may be disposed on side surfaces of the light passing member to block an external light entering on the side surfaces of the light passing member. Accordingly, a processed surface exposed by the opening may not be visible to a user.

According to one aspect of the invention, a display device, includes: a display panel including a first opening disposed in a display area; a window disposed on the display panel and including a second opening communicating with the first opening; and a light passing member at least partially within the first and second openings.

The light passing member may include: a first light passing part at least partially within the first opening; and a second light passing part at least partially within the first opening and having a width larger than a width of the first light passing part.

The light passing member may further include a light blocking member covering side surfaces of the first and second light passing parts.

The light blocking member may be further disposed on a bottom surface of the second light passing part.

The thickness of the light passing member may be larger than or substantially equal to a sum of a thickness of the window and a thickness of the display panel.

The thickness of the light passing member may be about 500 um to about 600 um.

The thickness of the window may be about 40 um to about 60 um.

An adhesive layer may be disposed between the display panel and the window, wherein the light passing member is insertable into the adhesive layer.

The adhesive layer may contact at least a portion of the second light passing part.

A buffer member may be disposed between the second light passing part and the window.

The buffer member may include a light blocking material.

The light passing member may include a glass.

The width of the second opening may be larger than a width of the first opening.

The display panel and the window may be, independently, foldable.

A protective film may be disposed under the display panel and supporting the display panel; and a support member may be disposed under the protective film and including an opening for folding the display panel and the window.

The shape of at least one of the first light passing part and the second light passing part may be a generally cylindrical shape.

The light passing member may further include a third light passing part disposed between the first light passing part and the second light passing part, wherein a width of the third light passing part may be larger than the width of the first light passing part and may be smaller than the width of the second light passing part.

The widths of the first and second light passing parts may be constant, respectively, wherein the width of the third light passing part may gradually decrease from a top to a bottom of the third light passing part.

A functional module may be disposed under the light passing member.

The functional module may include a camera module.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
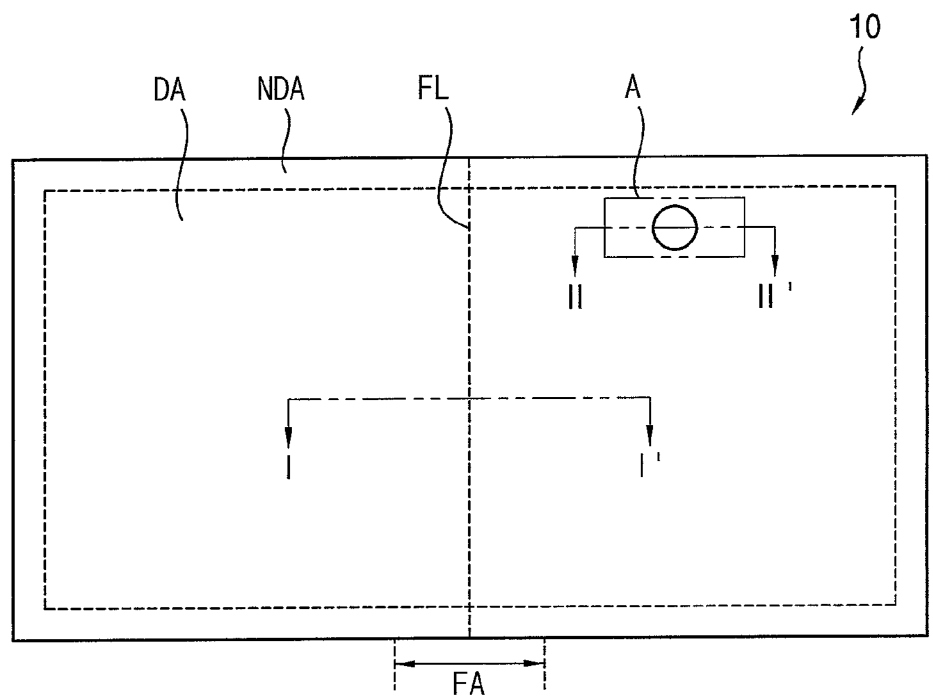
FIG. 1 is a plan view illustrating an exemplary embodiment of a display device constructed according to principles of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
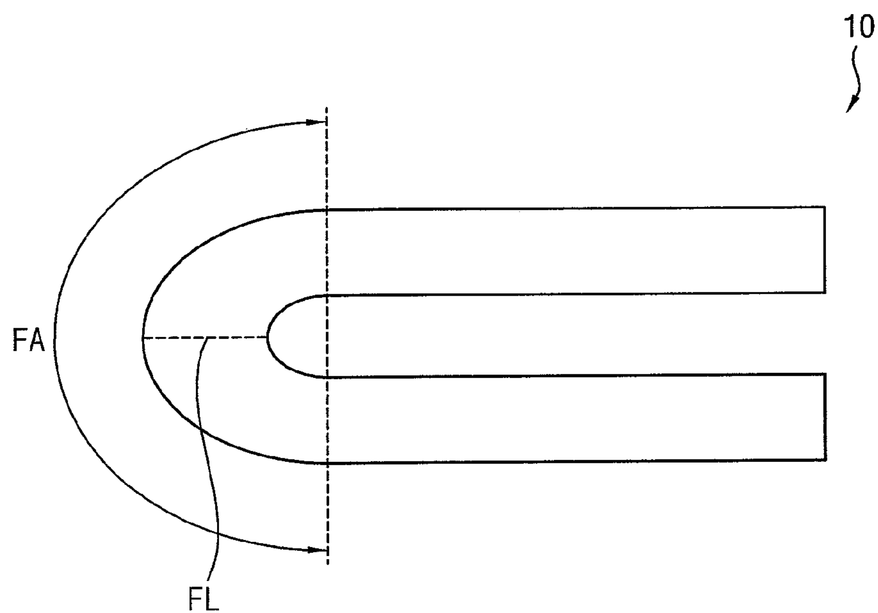
FIG. 2 is a side view illustrating the display device of FIG. 1.
Figure 3:
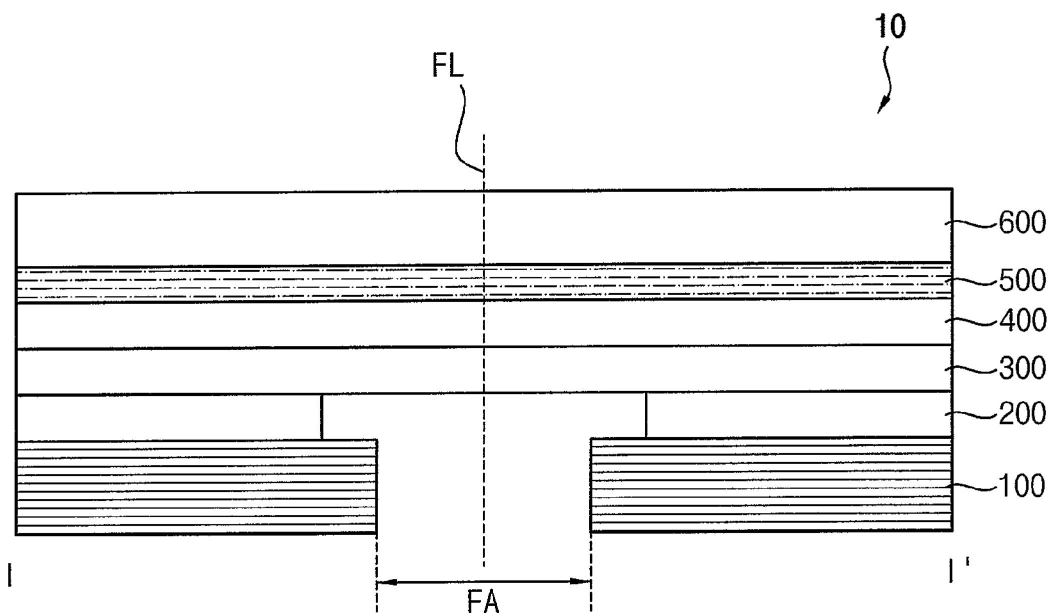
FIG. 3 is a cross-sectional view taken along line I-I' of FIG. 1.

FIG. 1 is a plan view illustrating an exemplary embodiment of a display device constructed according to principles of the invention. FIG. 2 is a side view illustrating the display device of FIG. 1. FIG. 3 is a cross-sectional view taken along line I-I' of FIG. 1.

Referring to FIGS. 1, 2, and 3, a display device 10 according to some exemplary embodiments may include a display area DA and a non-display area NDA surrounding the display area DA. Pixels may be disposed in the display area DA and an image may be displayed in the display area DA according to a driving signal. Wirings for transferring the driving signal and circuits for generating the driving signal may be disposed in the non-display area NDA. Accordingly, the image may not be displayed in the non-display area NDA.

In some exemplary embodiments, the display area DA may include a folding area FA. The display device 10 may perform folding and unfolding by an external force (e.g., user's manipulation) in the folding area FA. As shown in FIGS. 1 and 2, the display device 10 may be folded along a folding line FL, and accordingly, the display area DA may include the folding area FA and an unfolded flat area.

The display device 10 may have an in-folding structure in which a display surface is not exposed to an outside when the display device 10 is folded or an out-folding structure in which the display surface is exposed to the outside when the display device 10 is folded. In addition, the display device 10 may have a plurality of the folding areas FA or may have an asymmetric structure based on the folding line FL.

In some exemplary embodiments, the display device 10 may include a support member 100, a protective film 200, a display panel 300, a polarization layer 400, an adhesive layer 500 and a window 600. An opening overlapping the folding area FA may be formed in the support member 100 and the protective film 200, and the display panel 300, the polarization layer 400, the adhesive layer 500, and the window 600 may be folded. Accordingly, the display device 10 may perform the above-described folding and unfolding. In addition, an opening overlapping the folding area FA may not be formed in the display panel 300. Accordingly, the display device 10 may display the image in the folding area FA.

Figure 4:
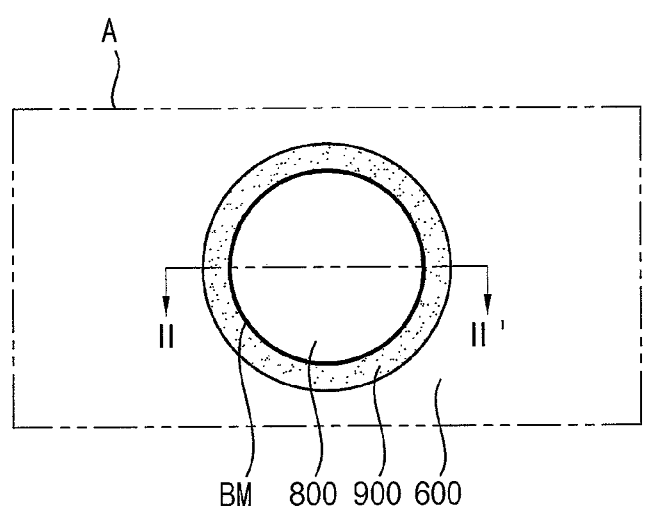
FIG. 4 is an enlarged plan view of area A of FIG. 1.
Figure 5:
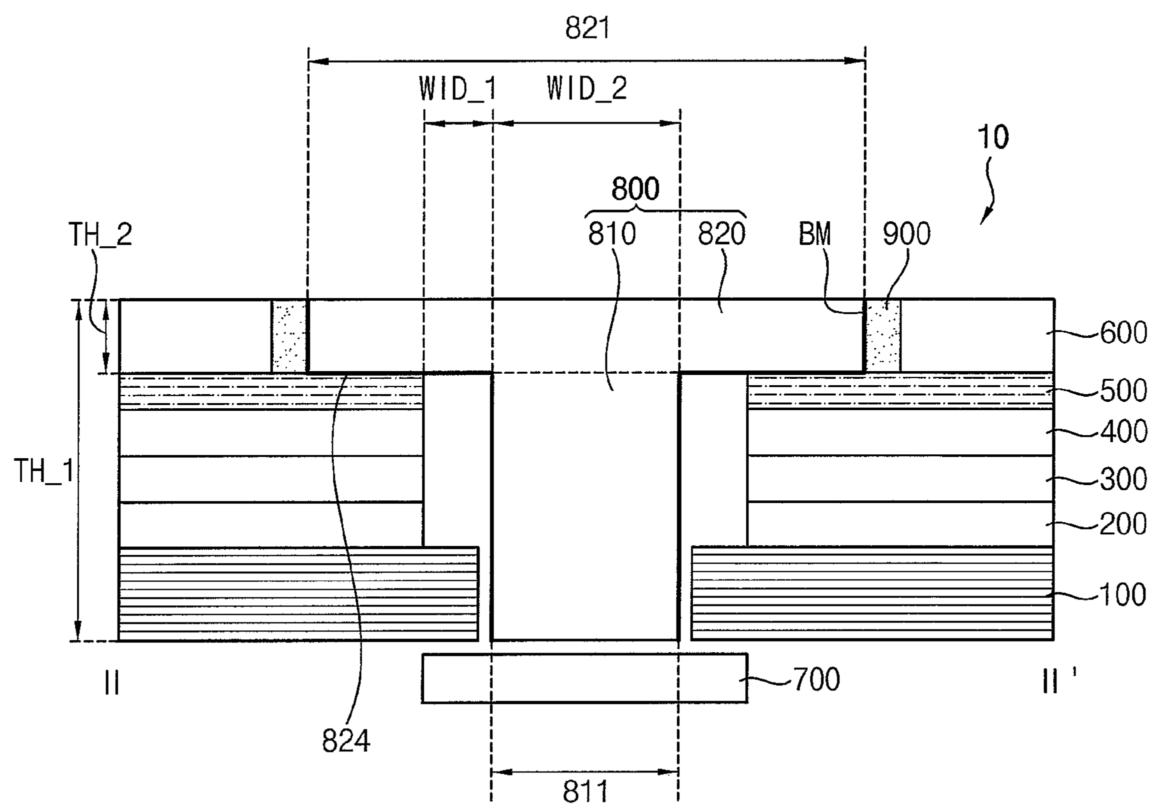
FIG. 5 is a cross-sectional view taken along line II-II' of FIG. 4.

FIG. 4 is an enlarged plan view of area A of FIG. 1. FIG. 5 is a cross-sectional view taken along line II-II' of FIG. 4.

Referring to FIGS. 1, 4, and 5, an opening may be formed in a portion A of the display area DA and a light passing member 800 may be inserted into the opening. In addition, a functional module 700 (e.g. a camera module, an illumination sensor, etc.) may be disposed under the light passing member 800 and an external light may be entered to the functional module 700 through the light passing member 800

In some exemplary embodiments, the display device 10 may include the support member 100, the protective film 200, the display panel 300, the polarization layer 400, the adhesive layer 500, the window 600, the light passing member 800, and a buffer member 900. The light passing member 800 may include a first light passing part 810, a second light passing part 820, and a light blocking member BM.

The display panel 300 may include a substrate, elements (e.g. thin film transistors), and the pixels. The substrate may be a glass substrate, a quart substrate, a plastic substrate, and so on. In some exemplary embodiments, to implement a flexible display device, the substrate may include a flexible plastic material. For example, the substrate may include a polyimide, a polyethylene terephthalate, a polyethylene naphthalate, a polyether ketone, a polycarbonate, a polyarylate, a polyether sulfone, or a combination thereof. The elements may be formed on the substrate and may transfer the driving signal to the pixels. The pixels may generate lights according to the driving signal.

The protective film 200 may be disposed under the display panel 300. The protective film 200 may prevent foreign matters such as dust and moisture from penetrating the display panel 300 and may absorb an impact. In addition, when the substrate of the display panel 300 includes the flexible plastic material, the protective film 200 may support the display panel 300.

The protective film 200 may be a plastic film. For example, the protective film 200 may include a polyethersulfone, a polyacrylate, a polyetherimide, a polyethylene a naphthalate, a polyphenylene sulfide, a polyarylate, polycarbonate, a polyarylene ether sulfone, a polyethylene terephthalate, a polyimide or a combination thereof.

The support member 100 may be disposed under the protective film 200. The support member 100 may support the display panel 300. The support member 100 may include a metal material having rigidity. For example, the support member 100 may include a stainless steel, titanium, copper, nickel, iron, or a combination thereof. The support member 100 may be connected to a hinge structure that enables folding of the display device 10.

A cushion may be further disposed between the support member 100 and the protective film 200. The cushion may contain air and buffer, and accordingly, the cushion may protect the display panel 300 from the impact. For example, the cushion may include an acrylic resin, a polyurethane, a thermoplastic polyurethane, a latex, a polyurethane foam, a polystyrene foam, or a combination thereof.

The polarization layer 400 may be disposed on the display panel 300. The polarization layer 400 may polarize the external light, and accordingly, a display quality of the display device 10 may be improved.

The adhesive layer 500 may be disposed on the polarization layer 400. The adhesive layer 500 may be disposed between the polarization layer 400 and the window 600 so that the polarization layer 400 is adhered to the window 600. In addition, the adhesive layer 500 may contact at least a portion 824 of the light passing member 800 so that the polarization layer 400 is adhered to the light passing member 800.

The adhesive layer 500 may include an organic adhesive material. For example, the adhesive layer 500 may include an optically clear adhesive, an optically clear resin, a pressure sensitive adhesive, and so on. The pressure sensitive adhesive may include an acrylate compound, a urethane compound, a silicone compound, or a combination thereof.

A first opening (for example, H_1 of FIG. 8) may be formed in the protective film 200, the display panel 300, the polarization layer 400, and the adhesive layer 500. In some exemplary embodiments, to form the first opening, the protective film 200, the display panel 300, the polarization layer 400, and the adhesive layer 500 may be processed together. Accordingly, surfaces on which the protective film 200, the display panel 300, the polarization layer 400, and the adhesive layer 500 are processed may be aligned with each other. For the support member 100 to support the protective film 200, the display panel 300, the polarization layer 400, and the adhesive layer 500, an opening having a width smaller than a width of the first opening may be formed in the support member 100.

The window 600 may be disposed on the adhesive layer 500. The window 600 may prevent foreign matters such as dust and moisture from penetrating the display panel 300. In some exemplary embodiments, the window 600 may be folded. For example, the window 600 may include a polyimide, a polyethylene terephthalate, a polyethylene naphthalate, a polyether ketone, a polycarbonate, a polyarylate, a polyether sulfone, or a combination thereof. On the other hand, the window 600 may include a glass having a thin thickness.

In some exemplary embodiments, a thickness TH_2 of the window 600 may be about 40 um to about 60 um. While the thickness of a window included in a general display device is about 500 um, the window 600 included in the display device 10 may be implemented with a thinner thickness. Accordingly, the window 600 may be folded together when the display device 10 is folded by the external force.

A second opening (for example, H_2 of FIG. 10) may be formed in the window 600. The second opening may be communicated to the first opening and the width of the second opening may be larger than the width of the first opening.

The light passing member 800 may be at least partially within or inserted into the first opening and the second opening. The light passing member 800 may prevent foreign matters such as dust and moisture from penetrating into an inside of the display device 10 and may protect the functional module 700 from the impact. In some exemplary embodiments, the light passing member 800 may be formed of a glass. In another exemplary embodiment, the light passing member 800 may be formed of a plastic that transmits light. For example, the light passing member 800 may include a polyimide, a polyacrylate, a polymethylmethacrylate, a polycarbonate, a polyethylene naphthalate, a polystyrene or a combination thereof.

In some exemplary embodiments, the light passing member 800 may include the first light passing part 810 at least partially within or inserted into the first opening and the second light passing part 820 at least partially within inserted into the second opening. The width 821 of the second light passing part 820 may be larger than the width 811 of the first light passing part 810. Because the width 821 of the second light passing part 820 is formed to be larger than the width 811 of the first light passing part 810, at least a portion 824 of the second light passing part 820 may contact the adhesive layer 500. Accordingly, the light passing member 800 may be insertable into the first and second openings, may be fixed to the first and second openings, and may prevent foreign matters such as dust and moisture from penetrating into the inside of the display device 10.

In some exemplary embodiments, a thickness TH_1 of the light passing member 800 may be about 500 um to about 600 um. In this case, as shown in FIG. 5, the thickness TH_1 of the light passing member 800 may be substantially same as the thickness of the display device 10. Because the light passing member 800 is formed to have a sufficient thickness TH_1, the light passing member 800 may not be deformed despite the load applied to the light passing member 800. In addition, despite the impact applied to the light passing member 800, the light passing member 800 may not be damaged and may protect the functional module 700.

The buffer member 900 may be disposed between the second light passing part 820 and the window 600. The buffer member 900 may prevent the second light passing part 820 from colliding with the window 600. In some exemplary embodiments, the buffer member 900 may include a resin (e.g., an epoxy resin, a urethane resin, etc.). In another exemplary embodiment, the buffer member 900 may include a same adhesive material as an adhesive material included in the adhesive layer 500.

The buffer member 900 may include a self-healing material, and accordingly, the buffer member 900 may recover scratches due to the impact. In addition, the buffer member 900 may include a light blocking material. Accordingly, the adhesive layer 500 overlapping the buffer member 900 may not be visible to a user.

The light blocking member BM may block a transmission of light. For example, the light blocking member BM may be a black matrix. For example, the light blocking member BM may include an organic material such as a black pigment or a black dye. The light blocking member BM may prevent the processed surfaces of the protective film 200, the display panel 300, the polarization layer 400, and the adhesive layer 500 from being visible to the user through the first opening and the second opening. Accordingly, the light blocking member BM may prevent the external light from entering the processed surfaces. Accordingly, the light blocking member BM may prevent the external light from being reflected from the processed surfaces and entering the functional module 700 so that an efficiency of the functional module 700 is improved. In some exemplary embodiments, the functional module 700 may be a camera module and the light blocking member BM may suppress a light spreading of the camera module to improve a quality of the camera module.

The light blocking member BM may cover the side surface of the light passing member 800 and the bottom surface of the second light passing part 820. Because the light blocking member BM covers the side surface of the light passing member 800, a distance WID_1 between the processed surfaces and the first light passing part 810 may be reduced and a width WID_2 of the first light passing part 810 may be increased. Accordingly, as shown in FIG. 4, a thickness of the light blocking member BM may be reduced and the area of the light passing member 800 may be increased. Therefore, more external light may enter the functional module 700 and the efficiency of the functional module 700 is improved.

Figure 6:
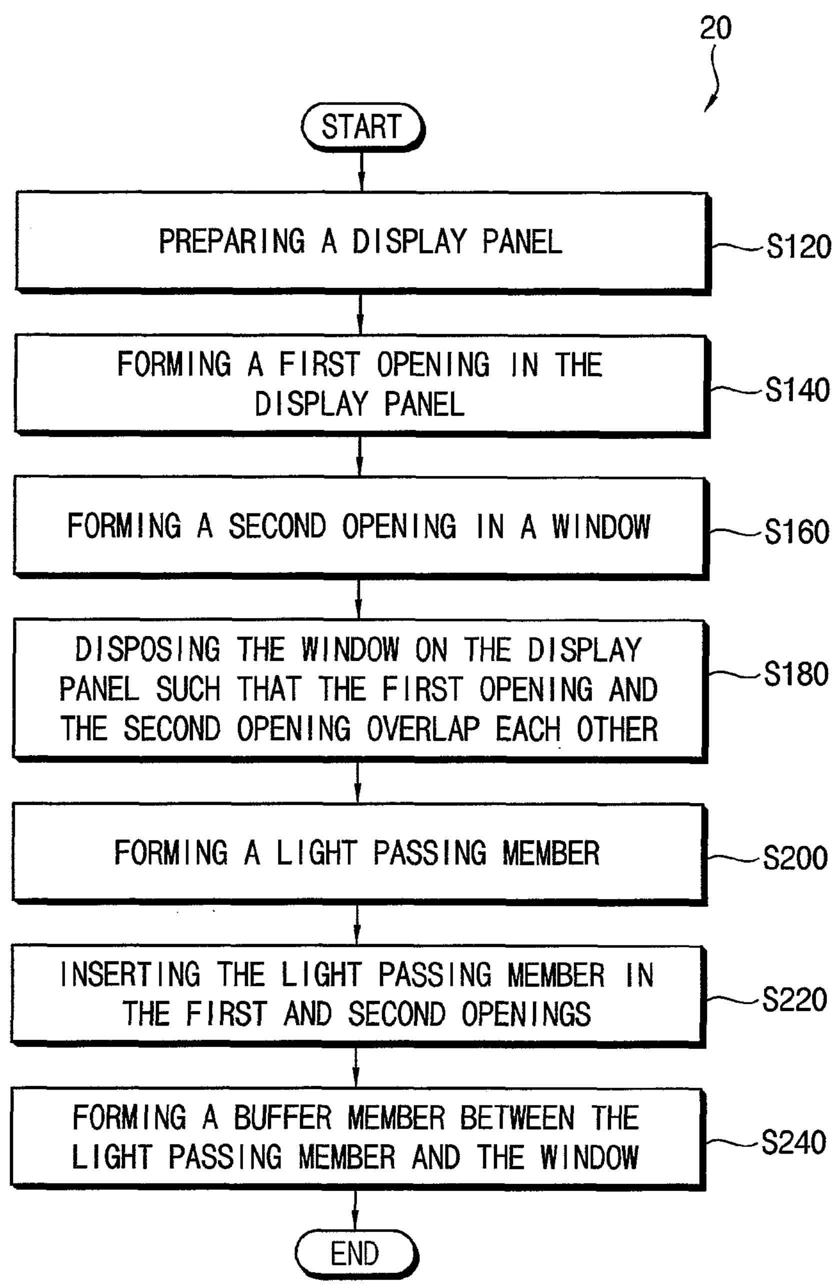
FIG. 6 is a flowchart illustrating another exemplary embodiment of a manufacturing method of a display device according to principles of the invention.
Figure 13:
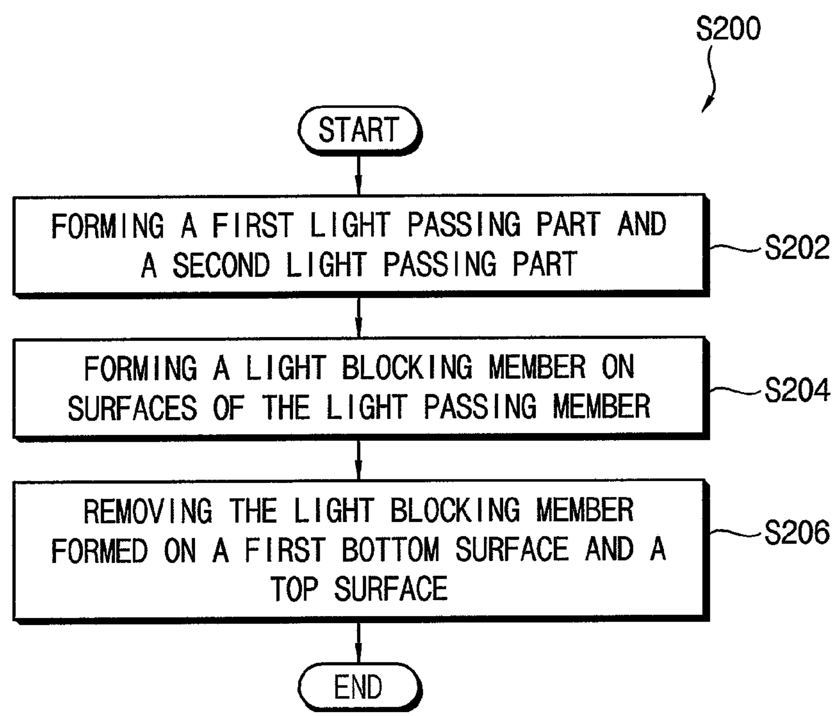
FIG. 13 is a flowchart illustrating a further exemplary embodiment of a manufacturing method of a light passing member according to principles of the invention.
Figure 14:
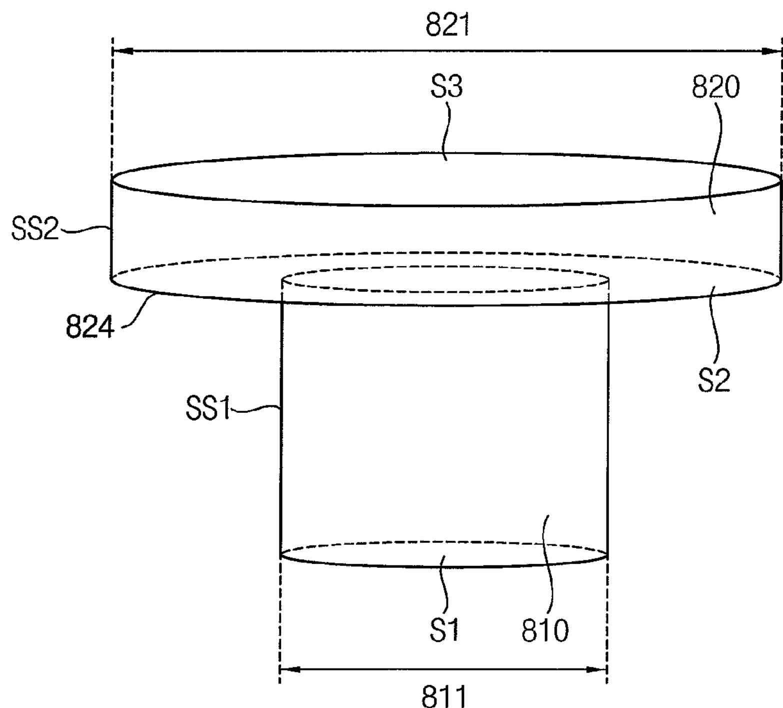
FIGS. 14, 15, and 16 are perspective views illustrating the manufacturing method of the light passing member of FIG. 13.
Figure 15:
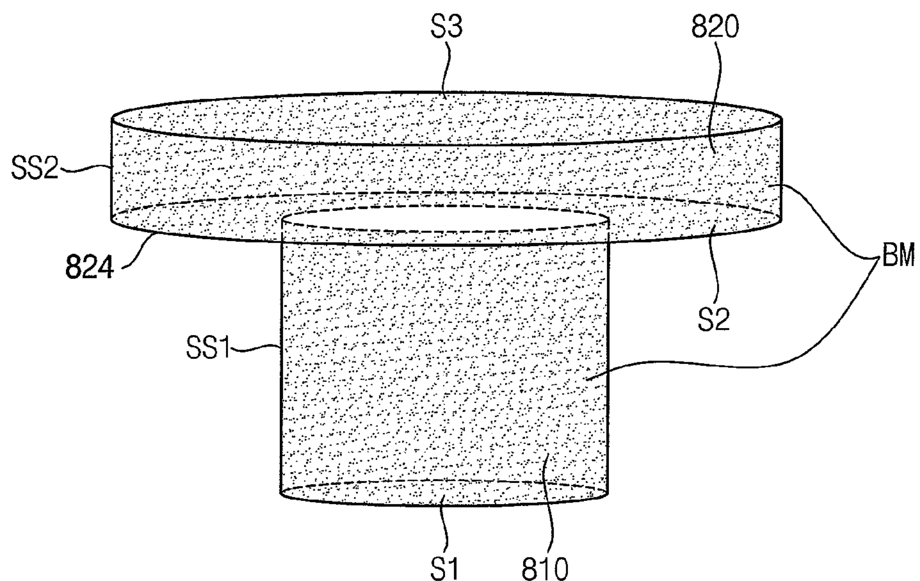
Figure 16:
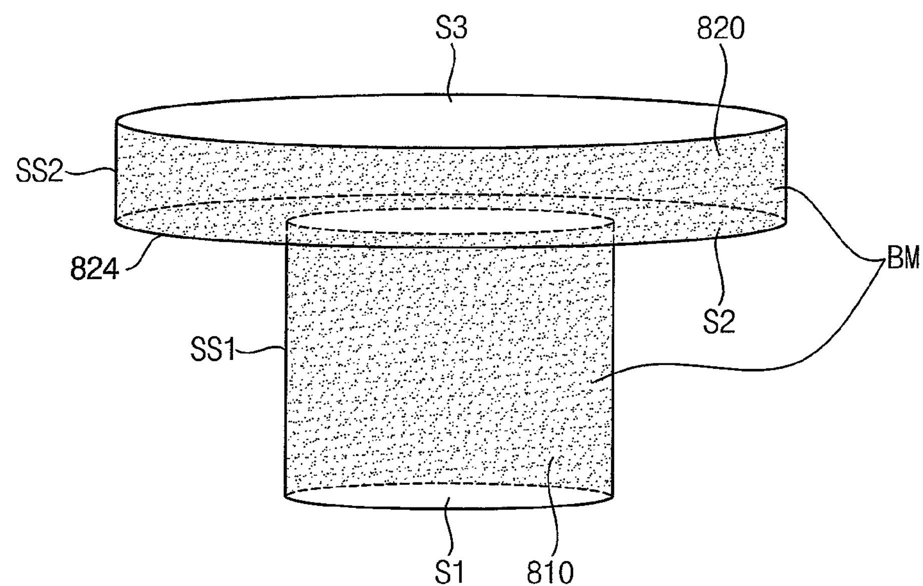

FIG. 6 is a flowchart illustrating another exemplary embodiment of a manufacturing method of a display device according to principles of the invention. FIGS. 7 to 12 are cross-sectional views illustrating the manufacturing method of the display device of FIG. 6. FIG. 13 is a flowchart illustrating a further exemplary embodiment of a manufacturing method of a light passing member according to principles of the invention. FIGS. 14 to 16 are perspective views illustrating the manufacturing method of the light passing member of FIG. 13.

Figure 7:
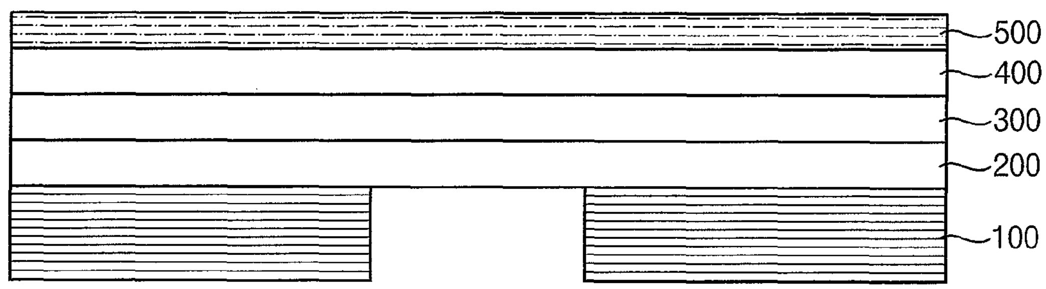
FIGS. 7, 8, 9, 10, 11, and 12 are cross-sectional views illustrating the manufacturing method of the display device of FIG. 6.

Referring to FIGS. 6 and 7, a manufacturing method 20 of the display device 10 according to some exemplary embodiments may include preparing the display panel 300 (S120). In detail, after the display panel 300 is formed, the protective film 200 and the support member 100 may be formed under the display panel 300. In addition, after the display panel 300 is formed, the polarization layer 400 and the adhesive layer 500 may be formed on the display panel 300. Because the support member 100, the protective film 200, the display panel 300, the polarization layer 400, and the adhesive layer 500 are a substantially same as described above, detailed description thereof will be omitted to avoid redundancy.

Figure 8:
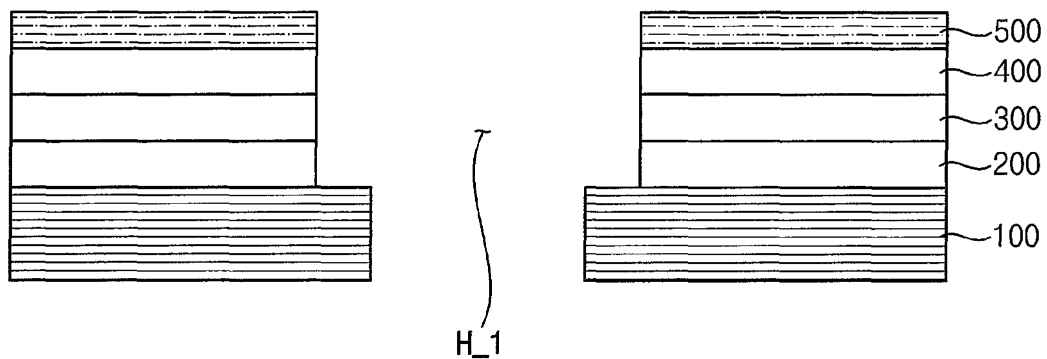

Referring to FIGS. 6 and 8, the manufacturing method 20 of the display device 10 may include forming the first opening H_1 in the display panel 300 (S140). To form the first opening H_1, a laser may be irradiated to the area where the first opening H_1 is to be formed or another etching process may be performed. In some exemplary embodiments, to form the first opening H_1, the protective film 200, the display panel 300, the polarization layer 400, and the adhesive layer 500 may be processed together. Accordingly, the surfaces on which the protective film 200, the display panel 300, the polarization layer 400, and the adhesive layer 500 are processed may be aligned with each other.

Figure 9:
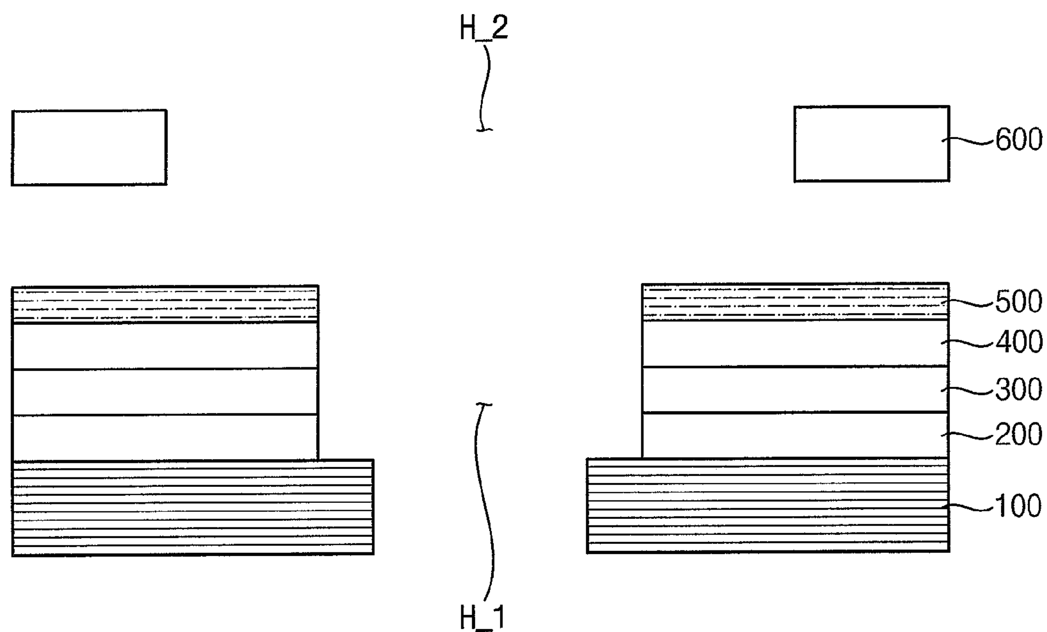
Figure 10:
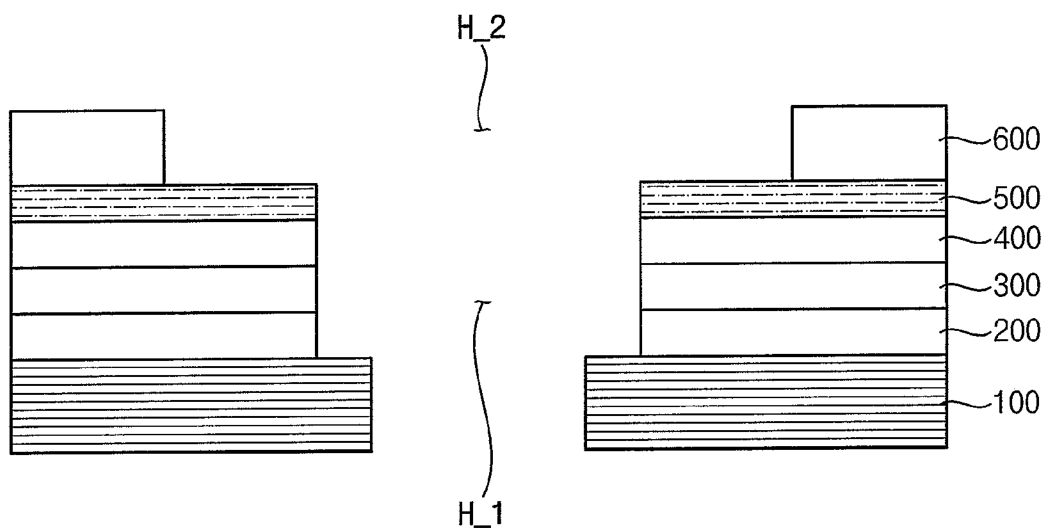

Referring to FIGS. 6, 9, and 10, the manufacturing method 20 of the display device 10 may include forming the second opening H_2 in the window 600 (S160). In some exemplary embodiments, the width of the second opening H_2 may be larger than the width of the first opening H_1. In addition, the manufacturing method 20 of the display device 10 may include disposing the window 600 on the adhesive layer 500 such that the first opening H_1 and the second opening H_2 overlap each other (S180). In some exemplary embodiments, after the second opening H_2 is formed in the window 600, the window 600 in which the second opening H_2 is formed may be disposed on the adhesive layer 500. Accordingly, the second opening H_2 may be appropriately formed in the window 600 without being affected by an adhesive force of the adhesive layer 500.

Figure 11:
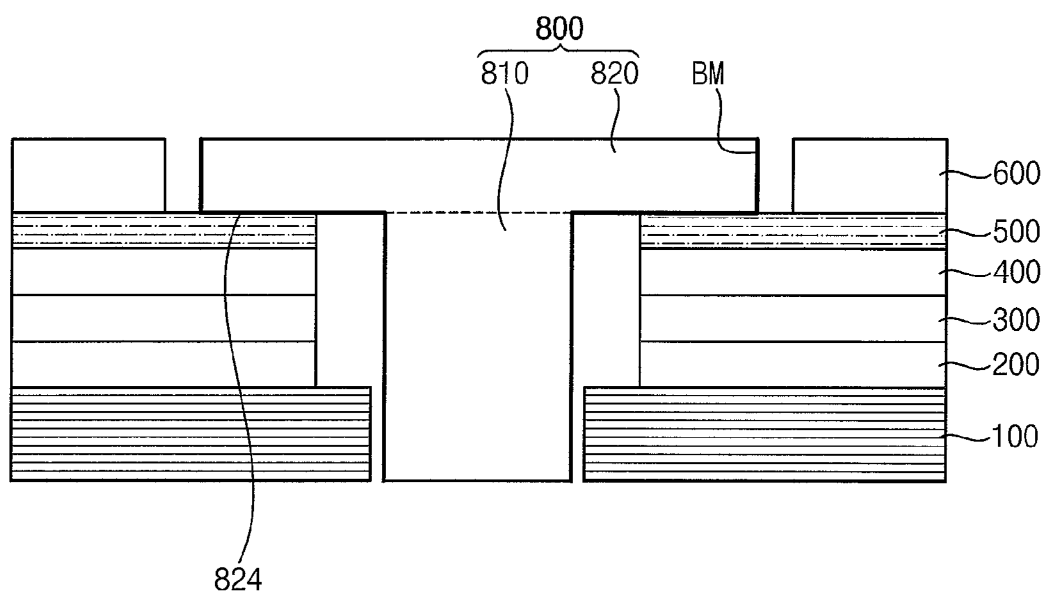
Figure 12:
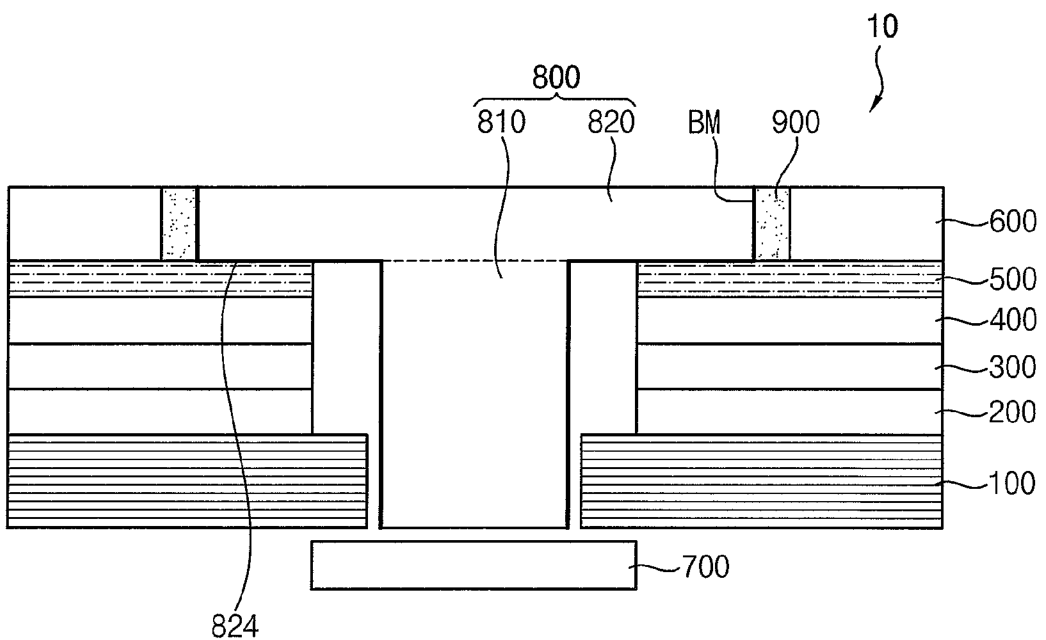

Referring to FIGS. 6, 11, and 12, the manufacturing method 20 of the display device 10 may include forming the light passing member 800 (S200), inserting the light passing member 800 in the first and second openings H_1 and H_2 (S220), and forming the buffer member 900 between the light passing member 800 and the window 900 (S240). The buffer member 900 may be filled in a space between the light passing member 800 and the window 600. A method of forming the light passing member 800 may be described below.

Referring to FIGS. 5, 6, 13, and 14, to form the light passing member 800, the first light passing part 810 and the second light passing part 820 may be formed (S202). In this case, the first and second light passing parts 810 and 820 may be formed such that the width 821 of the second light passing part 820 is larger than the width 811 of the first light passing part 810. In some exemplary embodiments, as shown in FIG. 14, a shape of each of the first and second light passing parts 810 and 820 may be a generally cylindrical shape. The first light passing part 810 and the second light passing part 820 may be integrally formed.

In some exemplary embodiments, the first passing part 810 may include a first bottom surface S1 and a first side surface SS1 and may correspond to the first opening H_1. The second passing part 820 may include a top surface S3, a second side surface SS2, and a second bottom surface S2 opposing to the top surface S3, and may correspond to the second opening H_2.

Referring to FIGS. 5, 6, 13, and 15, to form the light passing member 800, the light blocking member BM may be entirely formed on surfaces of the light passing member 800 (S204). In some exemplary embodiments, the light blocking member BM may be formed on the first bottom surface S1, the first side surface SS1, the second bottom surface S2, the second side surface SS2, and the top surface S3. As described above, the light blocking member BM may block the transmission of light, and for example, the light blocking member BM may include the organic material such as the black pigment or the black dye.

Referring to FIGS. 5, 6, 13, and 16, to form the light passing member 800, the light blocking member BM formed on the first bottom surface S1 and the top surface S3 may be removed (S206). The light blocking member BM may cover side surfaces of the first and second light passing parts 810 and 820. Accordingly, the external light may pass through the light passing member 800 and may enter the functional module 700.

Figure 17:
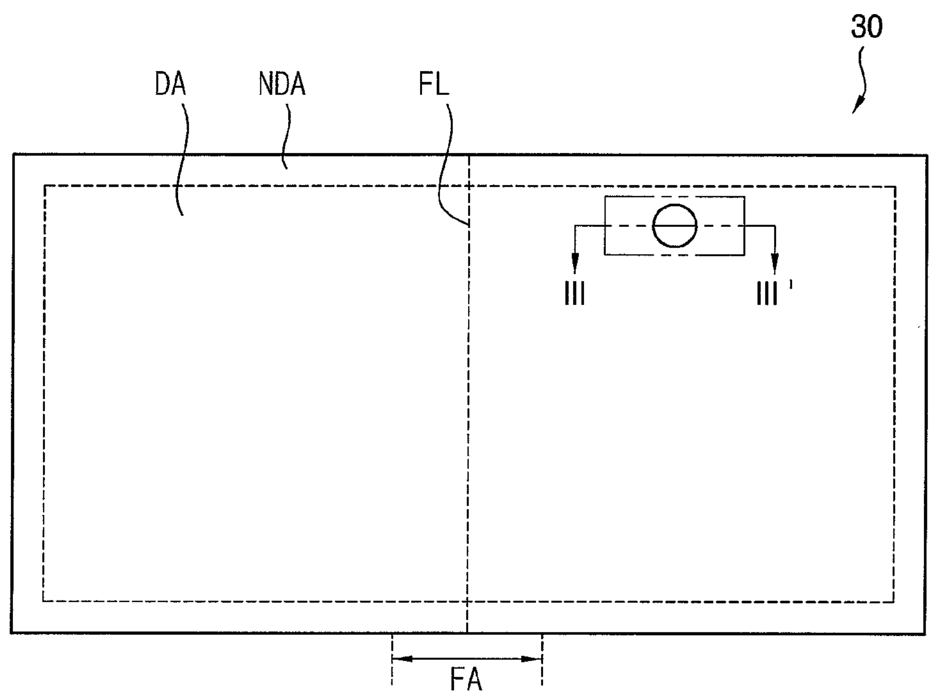
FIG. 17 is a plan view illustrating still another exemplary embodiment of a display device constructed according to principles of the invention.
Figure 18:
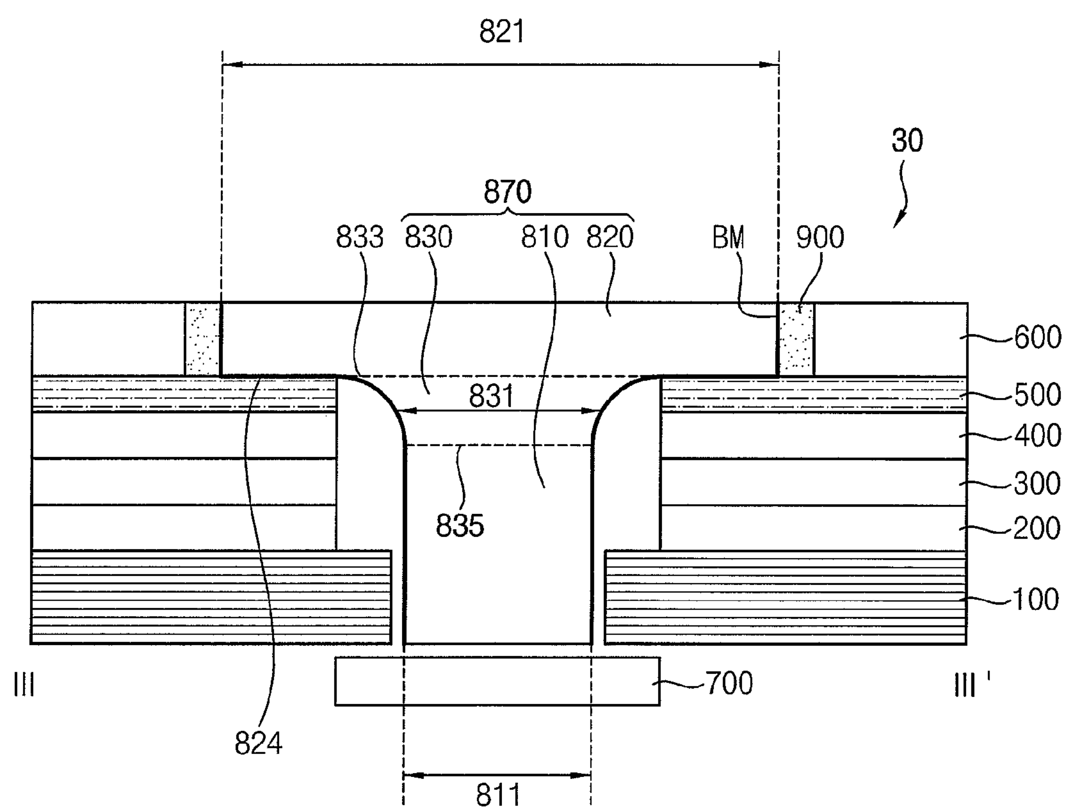
FIG. 18 is a cross-sectional view taken along line of FIG. 17.

FIG. 17 is a plan view illustrating still another exemplary embodiment of a display device constructed according to principles of the invention. FIG. 18 is a cross-sectional view taken along line of FIG. 17.

Referring to FIGS. 17 and 18, a display device 30 according to another exemplary embodiment may include a support member 100, a protective film 200, a display panel 300, a polarization layer 400, an adhesive layer 500, a window 600, a light passing member 870, and a buffer member 900. However, because the display device 30 is a substantially same as the display device 10 described with reference to FIG. 5 except for the light passing member 870, only the light passing member 870 may be described below to avoid redundancy.

The light passing member 870 may include a first light passing part 810, a second light passing part 820, and a third light passing part 830. The first light passing part 810 may be inserted into the first opening H_1. The second light passing part 820 may be inserted into the second opening H_2 and the width of the second light passing part 820 may be larger than the width of the first light passing part 810. The third light passing part 830 may be disposed between the first light passing part 810 and the second light passing part 820. In this case, the third light passing part 830 may be integrally formed with the first and second light passing parts 810 and 820 and the light blocking member BM may cover side surfaces of the first to third light passing parts 810, 820, and 830.

In some exemplary embodiments, the widths 811 and 812 of the first and second light passing parts 810 and 820 may be constant, respectively. In this case, a width 831 of the third light passing part 830 may be larger than or equal to the width 811 of the first light passing part 810 and may be smaller than or equal to the width 821 of the second light passing part 820. In addition, as shown in FIG. 18, the width 831 of the third light passing part 830 may gradually decrease from a top 833 to a bottom 835 of the third light passing part 830. Accordingly, when the first to third light passing parts 810, 820, and 830 are integrally formed, the width of the lowermost portion of the third light passing part 830 may be substantially equal to the width 811 of the first light passing part 810 and the width of the uppermost portion of the third light passing part 830 may be substantially equal to the width 821 of the second light passing part 820. Therefore, the light passing member 870 may be more resistance to the load and the impact than the light passing member 800 described with reference to FIG. 5.

The exemplary embodiments may be applied to a display device and an electronic device using the display device. For example, some exemplary embodiments may be applied to a cellular phone, a smart phone, a video phone, a smart pad, a smart watch, a tablet PC, a car navigation system, a television, a computer monitor, a laptop, etc.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device, comprising:

a display panel including a first opening disposed in a display area;

a window disposed on the display panel and including a second opening communicating with the first opening; and a light passing member at least partially within the first and second openings, wherein the light passing member includes:

a first light passing part at least partially within the first opening; and a second light passing part at least partially within the first opening and having a width larger than a width of the first light passing part, wherein the light passing member further includes a light blocking member covering all side surfaces and all bottom surfaces of the first and second light passing parts, wherein the second light passing part has a completely cylindrical shape, and wherein the first light passing part has a first light passing sub-part that has a completely cylindrical shape, and wherein the first light passing part has a second light passing sub-part provided between the first light passing sub-part and the second light passing part, in which the second light passing sub-part has a fluted shape that increases in diameter as a distance from the first light passing sub-part increases.

2. The display device of claim 1, wherein a thickness of the light passing member is larger than or substantially equal to a sum of a thickness of the window and a thickness of the display panel.

3. The display device of claim 2, wherein the thickness of the light passing member is about 500 μm to about 600 μm.

4. The display device of claim 2, wherein the thickness of the window is about 40 μm to about 60 μm.

5. The display device of claim 1, further comprising:

an adhesive layer disposed between the display panel and the window, wherein the light passing member is insertable into the adhesive layer.

6. The display device of claim 5, wherein the adhesive layer contacts at least a portion of the second light passing part.

7. The display device of claim 1, further comprising:

a first buffer member disposed between a first side of the second light passing part and the window; and a second buffer member disposed between a second side of the second light passing part and the window, the first side is opposite to the second side.

8. The display device of claim 7, wherein the buffer member includes a resin.

9. The display device of claim 1, wherein the light passing member includes a glass.

10. The display device of claim 1, wherein a width of the second opening is larger than a width of the first opening.

11. The display device of claim 1, wherein the display panel and the window are, independently, foldable.

12. The display device of claim 11, further comprising:

a protective film disposed under the display panel and supporting the display panel; and a support member disposed under the protective film and including an opening for folding the display panel and the window.

13. The display device of claim 1, wherein a shape of at least one of the first light passing part and the second light passing part is a generally cylindrical shape.

14. The display device of claim 1, wherein the light passing member further includes a third light passing part disposed between the first light passing part and the second light passing part, wherein a width of the third light passing part is larger than the width of the first light passing part and is smaller than the width of the second light passing part.

15. The display device of claim 7, buffer member includes a self-healing material that is recoverable from scratches applied thereto.

16. The display device of claim 1, further comprising a functional module disposed under the light passing member.

17. The display device of claim 16, wherein the functional module comprises a camera module.

* * * * *